United States Patent [19]
Daberko et al.

[11] Patent Number: 5,842,170
[45] Date of Patent: Nov. 24, 1998

[54] METHOD FOR EDITING IN HAND HELD RECORDER

[75] Inventors: Norbert P. Daberko, Oceanside; Richard K. Davis; Richard D. Bridgewater, both of San Diego, all of Calif.

[73] Assignee: Norris Communications Corp., San Diego, Calif.

[21] Appl. No.: 772,378

[22] Filed: Dec. 23, 1996

Related U.S. Application Data

[63] Continuation of Ser. No. 339,139, Nov. 14, 1994.
[51] Int. Cl.⁶ ...................................................... G10L 9/00
[52] U.S. Cl. ............................................. 704/278; 365/27
[58] Field of Search ................................. 395/2.79, 2.81, 395/2.87, 803, 2.69; 455/31.2, 31.3; 704/278, 272, 270, 260; 365/27, 49

[56] References Cited

U.S. PATENT DOCUMENTS

| 4,468,751 | 8/1984 | Plunkett, Jr. | 364/900 |
|---|---|---|---|
| 4,627,001 | 12/1986 | Stapleford et al. | 395/2.69 |
| 4,942,598 | 7/1990 | Davis | 455/31.2 |
| 5,126,543 | 6/1992 | Bergeron et al. | 235/462 |
| 5,126,987 | 6/1992 | Shiba et al. | 369/32 |
| 5,267,155 | 11/1993 | Buchanan et al. | 395/803 |
| 5,296,688 | 3/1994 | Hamilton et al. | 235/375 |
| 5,394,445 | 2/1995 | Ball et al. | 379/67 |
| 5,398,220 | 3/1995 | Barker | 369/25 |
| 5,477,511 | 12/1995 | Englehardt | 369/25 |
| 5,491,774 | 2/1996 | Norris et al. | 395/2.79 |
| 5,519,808 | 5/1996 | Benton, Jr. et al. | 395/2.79 |
| 5,542,115 | 7/1996 | Wong et al. | 455/31.3 |
| 5,610,774 | 3/1997 | Hayashi et al. | 360/15 |

FOREIGN PATENT DOCUMENTS 4207 447A1  9/1993  Germany .......................... G01L 5/04

OTHER PUBLICATIONS

Microsoft Press Computer Dictionary, Microsoft Press 2nd ed 1994 p. 168 ed Doyle.

Barre, "Flash Memory", IEEE Transactions on Magnetics, vol. 29, No. 6, Nov. 1993

Masuoka, "Technology Trend of Flash —EEPROM", IEEE Symposium on VLSI Technology Digests of Technical Papers, 1992.

Primary Examiner—David R. Hudspeth
Assistant Examiner—Scott Richardson
Attorney, Agent, or Firm—Thorpe, North & Western LLP

[57] ABSTRACT

A method and system for editing messages within a recording system includes a handheld recorder having flash memory and a plurality of memory address pointers for storing messages. The flash memory has a plurality of sequential memory blocks, each memory block has a plurality of memory locations, and the messages are stored as message segments. The plurality of memory address pointers stores an ordered sequence of addresses of said message segments within the flash memory. Upon an edit point being selected within a message at which the message is to be edited, the edit point corresponding to a first location within the message defining an end point of a first message segment, an edited message comprising a second message segment is generated. The second message segment is stored in a second memory block and the plurality of memory address pointers are altered to insert the address of the second message segment, and the message segments in the flash memory are played by accessing the corresponding addresses of the memory segments contained in the plurality of memory address pointers so that the message segments are played sequentially. A message fragment may be inserted into a message, deleted from a message, or all of the messages may be deleted from the flash memory.

13 Claims, 11 Drawing Sheets

Fig. 2A: RANDOM INSERTION

Fig. 2B

Fig. 3A: RANDOM DELETION

Fig. 3B

Fig. 4A: MESSAGE DELETE

Fig. 4B

Fig. 5A: BULK ERASING

Fig. 5B

Fig. 6A: OPTIMIZE

PRIOR TO OPTIMIZATION

ACTUAL AND FUNCTIONAL MEMORY STRUCTURE
AFTER OPTIMIZATION

*Fig. 6B*

METHOD FOR EDITING IN HAND HELD RECORDER

This application is a continuation of application Ser. No. 08/339,139, filed Nov. 14, 1994.

BACKGROUND OF THE INVENTION

1. Field of the Invention

This invention pertains to recording devices, and in particular to hand held recording devices that are used to record voice messages, where a multifunctional switch assembly on a solid state digital hand held recording device activates an edit mode whereby random insertion, random delete, individual message erasure, bulk message erasure and optimization of digitally recorded voice messages is accomplished.

2. Prior Art

The method for dictating voice messages is largely determined by the devices available for dictation. The prior art is replete with recording devices that save information by selectively magnetizing a layer of magnetic-oxide material that is bonded to a thin flexible tape, commonly known as cassette tape.

Tape is a medium with deficiencies that until the present invention have been unavoidable. These unavoidable deficiencies have turned the process of editing dictation into a typical sequence of the following steps:

1) The user begins recording and speaking;
2) The user rewinds a portion of the recording and listens to what was said;
3) The user does not like the phrasing used in the middle of a sentence, realizes that what was said is inadequate or incomplete, or desires to preface the thought with another;
4) The user again rewinds the recording;
5) The user rephrases the beginning of the sentence, hoping to repeat the end portion that was stated correctly; adds a more complete thought, and then tries to duplicate the correct end portion that was just recorded over; or states the prefacing thought, and then tries to restate the thought that was correct but is now recorded over.

The recording medium of cassette tape forces the speaker to use the above process because the tape is analog and linear. Thoughts cannot be randomly inserted in the middle of messages while trying to leave intact portions of an existing message that does not need changing. The speaker is forced to record over portions of a previously recorded message that the speaker does not want to lose. Thus, the speaker must try to remember verbatim what may have been a carefully phrased recorded thought that is now lost, while concentrating on correcting the recording.

It would be an improvement over the prior art to insert a message within an existing message such that when it is played back, a listener hears a portion of the original message, then without a pause hears the inserted message, then again without pause hears the remainder of the original message after the point of insertion. It would also be an improvement not to record over a portion of a message that does not need correcting while inserting the new message.

The recording medium of tape also makes deletion of only a portion of a message impractical. First, it would be difficult to accurately time the erasure without going beyond the segment to be erased. Second, the erased segment would also leave blank gaps that a user must listen to because the length of the erased segment is unknown. The user would have to fast-forward the tape and go past the erased segment, rewinding when the message resumed, if the recorder was capable of listening while fastforwarding.

Therefore, it would be an improvement to be able to listen to the portion of the message being erased and thereby stop erasure at a desired moment. It would also be an improvement to be able to reuse the segment of the recording medium that is now erased. A further improvement would be to listen to the message without having a pause where a segment of an existing message was deleted.

Tape has other deficiencies as well. A tape might contain several complete messages, but it may no longer be necessary to keep them all. If the messages to be kept are sporadically mixed among the messages no longer needed, attempting to record over old messages is too dangerous for fear of recording too long and erasing a message that must be kept. Therefore, recording space on the tape is unavailable until all messages can be erased.

It would be an improvement over the prior art to be able to erase individual messages and have the erased segments available for use without the danger of recording over messages to be kept. It would also be an improvement not to leave gaps between messages that are being kept.

Tape also suffers from the lack of being able to quickly erase all messages. For security, or for the purpose of not leaving old messages that can be mistaken for ones that must be kept, it would be an improvement to enable rapid bulk erasure of a recording medium.

Finally, tape suffers from the lack of ability to instantaneously move recorded messages. For example, if a tape is filled by five messages, but only two noncontiguous messages need to be kept, it may be impossible to record a new message over the old messages if a new message will not fit within the space occupied by the noncontiguous old messages.

It would be an improvement to be able to optimize the remaining space on a recording medium that has some messages that need to be kept by moving the saved messages to the beginning of the recording medium, leaving the maximum amount of space that is available for new messages to be recorded at the end of a recording medium.

OBJECTS AND SUMMARY OF THE INVENTION

It is therefore an object of the present invention to provide a method and apparatus for inserting a new message within a previously recorded voice message at a randomly chosen point wherein the existing message is not recorded over by the insertion and no delays in message playback occur because of the insertion.

It is another object of the invention to provide a method and apparatus for randomly deleting a portion of a recorded message such that the message segment being deleted is heard as it is being erased, when the message is played back there is no gap between the remaining message segments, and the deleted message space is available for recording new messages.

It is a further object of the present invention to provide a method and apparatus for deleting entire individual messages such that if the deleted message occupies memory space between messages, a user may listen to the remaining noncontiguous messages with no pause between them, and the deleted message space is available for recording new messages.

It is yet a further object of the invention to provide a method and apparatus for rapidly erasing the entire recording medium such that previously recorded messages cannot be recovered.

Yet another object of the invention is to provide a method and apparatus for optimizing memory space such that messages that are recorded noncontiguously in the recording medium can be moved and stored contiguously, providing the maximum contiguous memory space available on the recording medium for new messages.

These and other objects not specifically recited are realized in a solid state digital hand held recording device having a multifunctional switch assembly. A printed circuit board including a microcontroller electrically coupled to switch terminals operates to control the processing of sound into electrical signals and store said signals on a digital recording medium. A single, manually operable rocker-pad is centrally mounted upon a pivot support of the hand held recording device. The rocker-pad actuates electrical signals coupled to said microcontroller which includes read-only memory space wherein are stored a sequence of actions (a program) are actuated by said signals. A plurality of programs can be activated to insert messages within existing messages, delete messages and portions of messages, and optimize available memory space for recording new messages.

Also disclosed is a method for editing the digitally recorded sound. The process of randomly inserting a message within an existing message includes the steps of (i) playing a previously recorded digital voice message, (ii) pausing the message at the place where a new message is to be inserted, (iii) entering an edit mode, (iv) recording a new message, and (v) playing back the entire message with the new message seamlessly inserted within the original message.

Also disclosed is the process of deletion of a segment of an existing message which includes the steps of (i) playing a previously recorded digital voice message, (ii) pausing the message at the beginning of the portion of the message to be deleted, (iii) entering an edit mode, (iv) simultaneously deleting and listening to the segment of the message being deleted, (v) stopping the deletion process when the segment to be deleted has been heard entirely, and (vi) listening to the message without hearing a gap between existing message segments.

A further disclosure is made of the process of individual message erasure which includes the steps of (i) playing the message to be deleted, (ii) entering the edit mode, (iii) deleting the message the user was hearing, and (iv) listening to the message previous to and subsequent to the message deleted without a gap between them.

Also disclosed is the process of bulk message erasing which includes the steps of: (i) playing any of a plurality of messages, (ii) entering the edit mode, (iii) activating the bulk erasing process, and (iv) erasing the plurality of messages with a single command.

Finally, this application discloses the process of optimizing a recording medium by compacting all noncontiguous messages which includes the steps of: (i) playing any message, (ii) entering the edit mode, (iii) compacting all noncontiguous messages to a contiguous grouping, and (iv) defining an increased contiguous body of memory space available for recording new messages.

These and other objects and advantages of the present invention will be set forth in the description which follows, and will be apparent to those skilled in the art based on the description taken in combination with the accompanying drawings. The objects and advantages of the invention may be realized and obtained by means of the instruments and combinations particularly pointed out in the appended claims.

DETAILED DESCRIPTION OF THE INVENTION

Figure 1A:
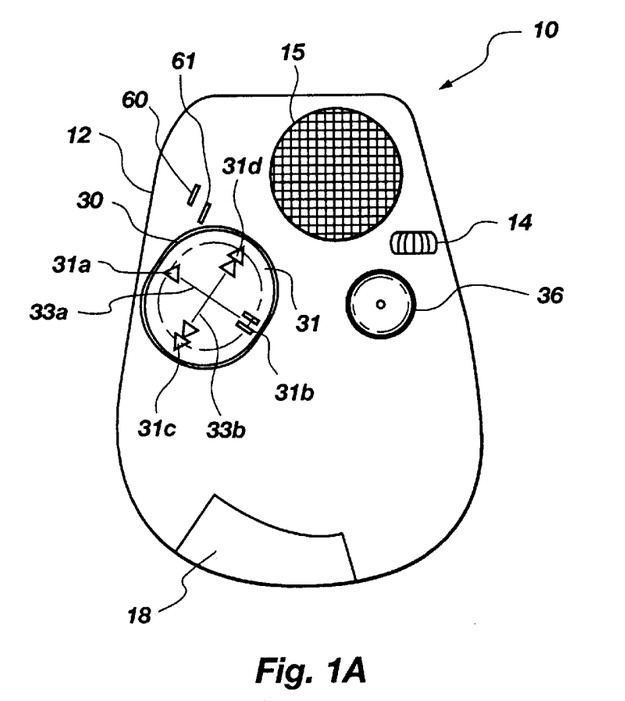
FIG. 1A is a front view of a hand held digital recording device with a multifunctional switch assembly made in accordance with the principles of the present invention.
Figure 1B:
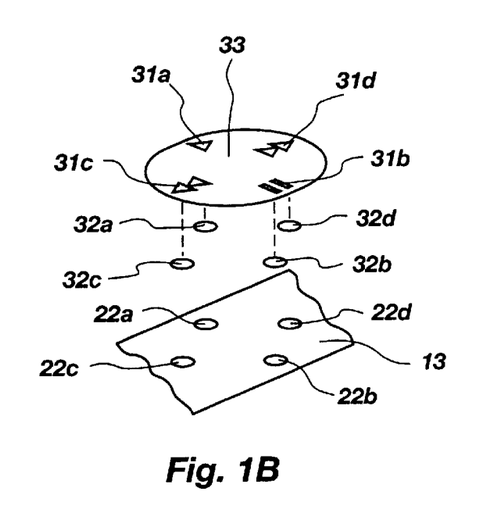
FIG. 1B is a perspective view of the multifunctional switch and the contact elements beneath from FIG. 1A.

FIG. 1 illustrates the features of a hand held, solid state digital recording device 10. The hand held recorder includes a casement 12 containing a microphone element 14, a speaker element 15, a printed circuit board 13 (fragmented view, FIG. 1B), and a recording medium 18 (partially visible). The printed circuit board 13 beneath the face of the casement 12 includes a microcontroller 20 with an internal read only memory (ROM), said microcontroller being electrically coupled to the recording medium 18 and to switch terminals 33 (multifunctional) and 36 (record) disposed on said circuit board 13 and appearing through openings in the casement 12. These components are well known within the industry.

The switch terminals 33 and 36 differ from each other in structure. Switch element 33 is a rocker-pad pivotally mounted upon a pivot support (not shown). The pivot support allows the rocker-pad 33 to tilt about said pivot support, being responsive to manual manipulation of said rocker-pad 33. The rocker-pad 33 includes a periphery portion 30 with at least four lateral extremities 31a, 31b, 31c, 31d having electrical contacts 32a, 32b, 32c, 32d (FIG. 1B) beneath the rocker-pad 33 and parallel to the circuit board 13. Electrical switch terminals 22a, 22b, 22c, 22d (FIG. 1B) disposed under the rocker-pad 30 are aligned with said electrical contacts 32. When the rocker-pad 33 is manipulated, an electrical contact corresponding to the rocker-pad extremity 31 makes contact with a corresponding switch terminal 22. The functions executable by manipulating the rocker-pad 33 are many, despite there being only four specific labels 31a, 31b, 31c, 31d corresponding to the rocker-pad 33 extremities. The four labels are play 31a, fast-forward 31d, pause 31b, and reverse 31c.

Figure 1C:
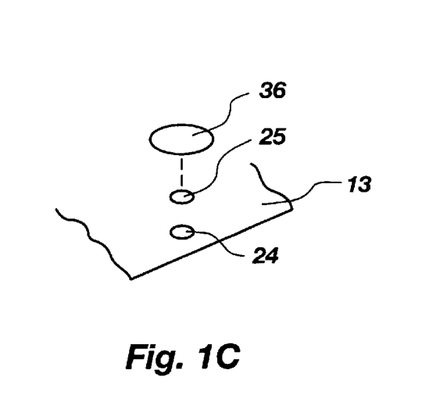
FIG. 1C is a perspective view of the record button and the contact element beneath from FIG. 1A.

An electrical signal is produced by making an electrical contact between one of the electrical contacts 32 and the corresponding switch terminal 22 disposed beneath. The signal goes to the microcontroller which determines which button of the rocker-pad 33 was pressed, whether the record button 36 was pressed, or a combination of the two. The microcontroller accesses the appropriate segment of internal ROM memory containing the instructions for executing the appropriate function. The buttons 33 and 36 may also be operated in conjunction to produce an electrical signal defining a process that can not be activated by pressing a single button. Switch element 36 is a manually operable record button. Switch terminal 24 (FIG. 1C) is disposed under the record button 36 and aligned to make contact between an electrical contact 25 disposed beneath the record button and the switch terminal 24 when the record button 36 is pressed. The electrical signal produced by depressing the record button 36 also sends a signal to the microcontroller 20 which accesses the appropriate segment of ROM memory containing the instructions for executing whatever function is defined by pressing the record button 36 alone or in conjunction with the multifunctional switch 33.

Figure 2A:
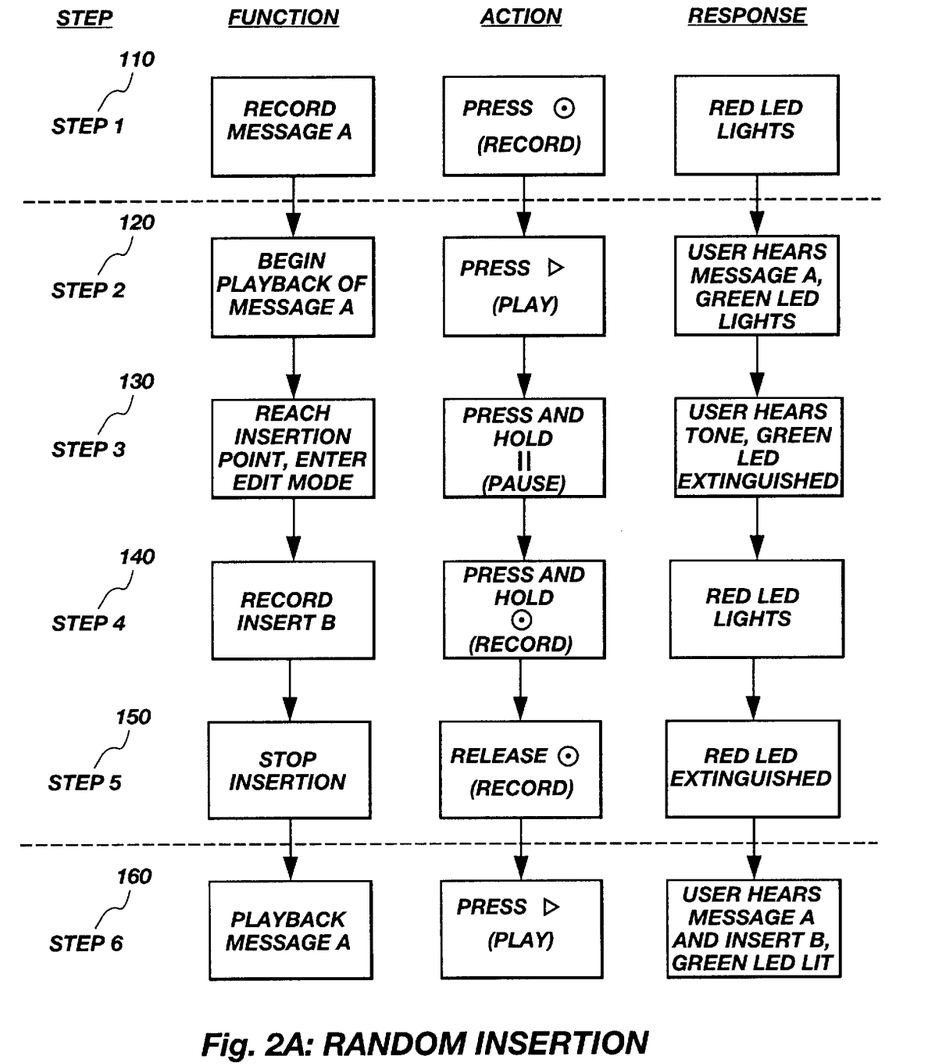
FIG. 2A is a flowchart of steps for executing a random insertion within a previously recorded digital message.

FIG. 2A is a flowchart of the steps to randomly insert, at a moment chosen by a user, a message within a previously recorded digitized message. In other words, a user plays back a previously recorded message and stops the message at the moment when another message is to be inserted. A user enters an edit mode, adds the new message in an edit record mode, and then stops the recording. The result of the insertion process is that when the original message is played back, it plays to the moment when a new message was inserted, the inserted message plays, and then the original message finishes playing, all without pauses between the original message and the inserted message.

As shown by step 1, designated 110, recording a message is a preliminary step to the insertion process. A message must have been previously recorded and is referred to as message A.

Step 2 designated as 120 shows that the user taps the rocker-pad switch labeled with the play symbol 31a. The user hears message A, and a green LED 60 is lit.

Step 3 designated as 130 shows that the user listens to message A being played back until the moment that the user desires to insert a new message segment, insert B. The user must pause the playback and enter the edit mode. This is accomplished by pressing and holding the pause button 31c on the rocker-pad 30. After a few seconds, the user hears a tone and the green LED 60 is extinguished. The user may then release the pause button 31c. The recorder is now in the edit mode.

The user then executes step 4 designated as 140. The user presses and holds the record button 36. When the red LED 61 (FIG. 1) lights, the device is recording.

When the user has finished recording message B, the user executes step 5 designated as 150. The user simply releases the record button 36, and recording stops.

Step 5 actually ends the insertion process, but step 6 designated as 160 illustrates one of the points of novelty of the present invention. When the user taps the play button 31a on the rocker-pad 33, message A starts playing from the beginning. When the point where insert B was inserted is reached, insert B begins playing, without a pause or gap. When insert B is finished, message A resumes playing where it was interrupted, again without a pause. The transition from message A to insert B and then back to message A is seamless, as if the user spoke the entire message, insert, message sequence without interruption.

Figure 2B:
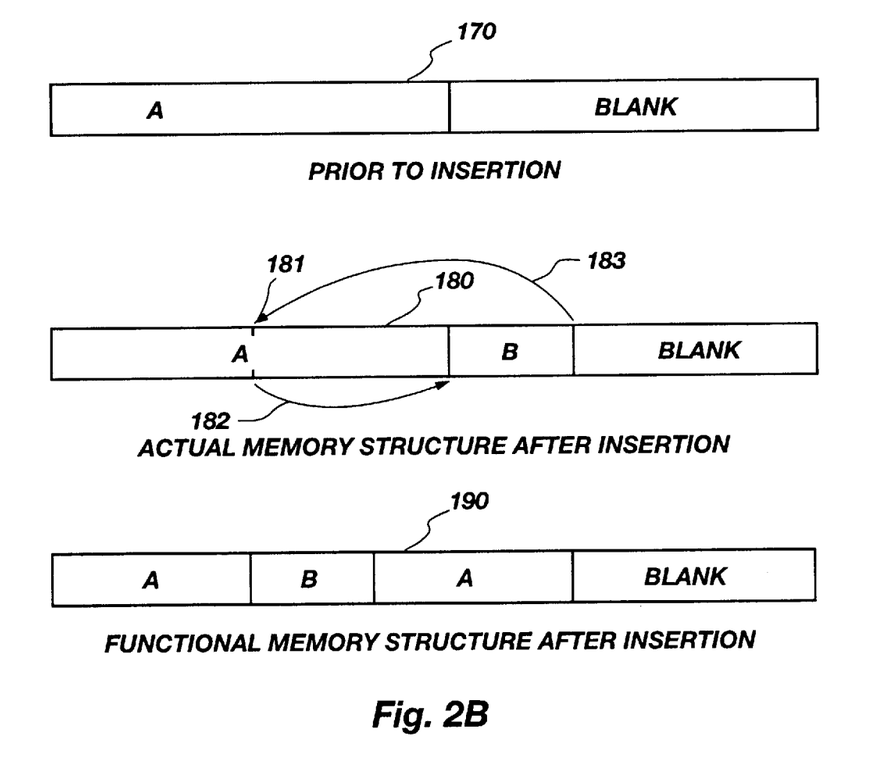
FIG. 2B is a diagram representing memory structure before and after partial message random insertion of FIG. 2A.

FIG. 2B is a diagram of the digital memory structure before and after insertion of a message into message A. Prior to insertion, the memory structure appears as shown in box 170 where message A occupies one contiguous memory block. After insertion of insert B, the actual memory structure appears as shown in box 180. As illustrated, message A is still intact, and message B occupies the next contiguous available space in memory. However, functionally message A will play back as if the actual memory structure is as shown in box 190. Message A plays until the insertion point 181 in box 180. Then insert B plays, and message A resumes playing when insert B is finished. The playback is jumping to a different point in memory as shown by arrow 182. When the insert has finished, playback jumps as shown by arrow 183 and playback resumes.

Figure 3A:
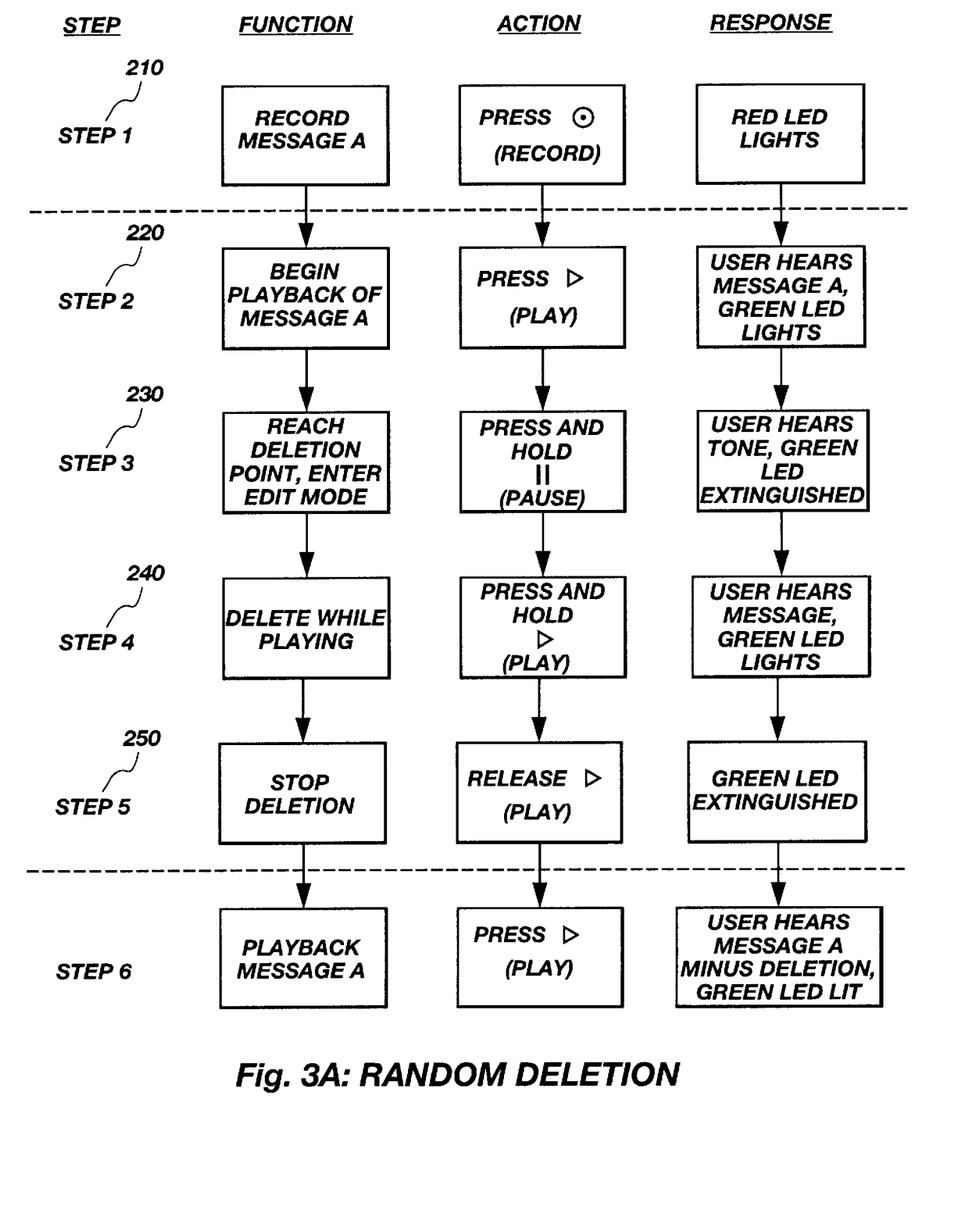
FIG. 3A is a flowchart of steps for executing a random deletion of a segment of previously recorded digital message.

FIG. 3A is a flowchart of the steps to randomly delete, at a moment chosen by a user, a segment of a previously recorded digitized message. In effect, a user plays a previously recorded message and stops the message at the moment when the following segment of the message is to be deleted. A user enters an edit mode, deletes a segment of the message, and stops the deletion. The end result of the deletion process is that when the original message is played, the deleted portion is instantly skipped resulting in no pauses between the portions of the message before and after the deleted segment.

Step 1 designated by 210 is not part of the deletion process, but illustrates that a previously recorded message, referred to as message A, must exist.

Step 2 designated as 220 shows that the user taps the rocker-pad switch labeled with the play symbol 31a. The green LED 60 lights during playback.

Step 3 designated as 230 shows that the user listens to message A until the moment that the user desires to delete a message segment. The user must pause the playback and enter the edit mode. This is accomplished by pressing and holding the pause button 31b on the rocker-pad 33. After a few seconds, the user hears a tone. The user may then release the pause button 31b. The recorder is now in the edit mode.

The user must then execute step 4 designated as 240. The user presses and holds the play button 31a. The red LED 61 lights while the play button 31a is held. Everything that the user hears is deleted from message A.

When the user has finished deleting a segment of message A, the user executes step 5, designated as 250. The user simply releases the play button 31a, and deletion stops.

Step 5 actually ends the deletion process, but step 6 designated as 260 illustrates one of the points of novelty of the present invention. When the user presses the play button 31a on the rocker-pad 33, message A begins playing from the beginning. When the point where deletion of message A is reached, the deleted portion is not heard, and the portion of message A following the deletion immediately begins to play, without a pause. The transition from the portion of message A before deletion to the portion of message A after deletion is seamless, as if the user had never spoken the deleted segment.

Figure 3B:
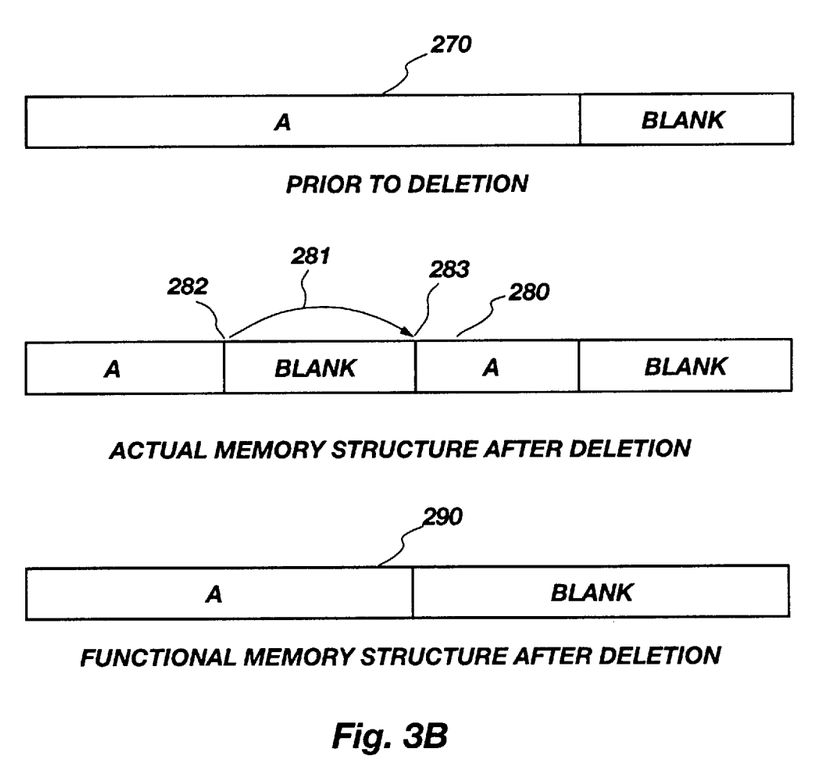
FIG. 3B is a diagram representing memory structure before and after partial message random deletion of FIG. 3A.

FIG. 3B is a diagram of the digital memory structure before and after deletion of a segment of message A. Prior to deletion, the memory structure appears as shown in box 270 where message A occupies one contiguous memory block. After deletion of a segment of message A, the actual memory structure appears as shown in box 280. As illustrated, a blank portion of memory is now skipped as shown by arrow 281. However, functionally, the message A will play back as if the actual memory structure is as shown in box 190, where message A still appears as one contiguous block of memory. Message A plays until the deletion point 282 in box 280. Playback then skips to point 283, and message A resumes playing.

Figure 4A:
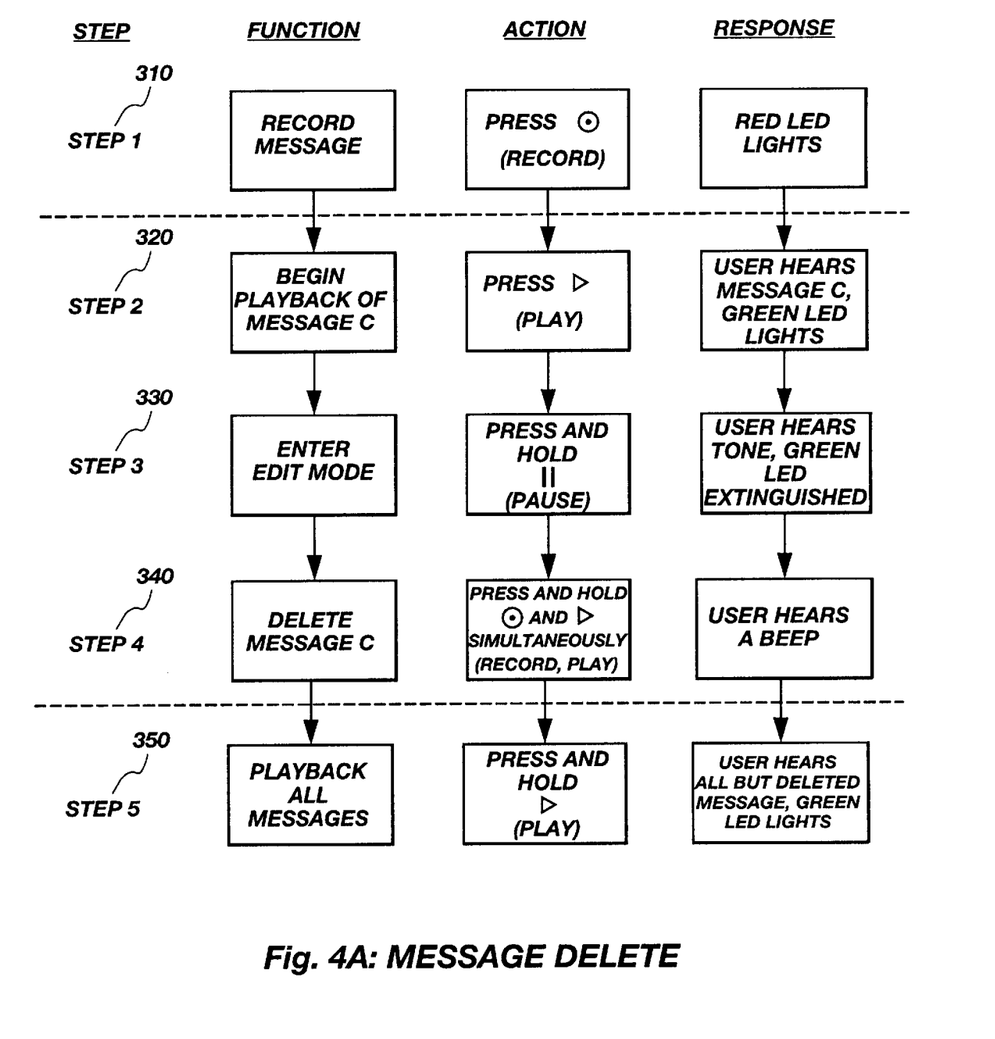
FIG. 4A is a flowchart of steps for erasing an entire individual previously recorded digital message.

FIG. 4A is a flowchart of the steps to delete an entire message. In effect, a user plays a previously recorded message and stops the message at any time while the message is playing. A user enters an edit mode and deletes the message. The end result of the deletion process is that when the messages recorded previous and subsequent to the deleted message are played, no time gap occurs when listening to them.

Step 1 designated by 310 is not part of the deletion process, but illustrates that a previously recorded message must exist. The example below will assume that a plurality of messages exist, labelled A, B, C and D, and that message C is to be deleted.

Step 2 designated as 320 shows that the user taps the rocker-pad 33 switch labeled with the play symbol 31*a* to hear message C. The green LED 60 lights during playback.

Step 3 designated as 330 shows that the user listens to verify that message C is playing. The user must pause the playback at any time during message C and enter the edit mode. This is accomplished by pressing and holding the pause button 31*b* on the rocker-pad 33. After a few seconds, the user hears a tone. The user may then release the pause button 31*b*. The recorder is now in the edit mode.

The user must then execute step 4 designated as 340. The user simultaneously presses and holds the record 36 and play 31*a* buttons. The user hears a single short beep indicating that message C is deleted.

Step 4 actually ends the deletion process, but step 5 designated as 350 illustrates one of points of novelty of the present invention. When the user presses and holds the play button 31*a* on the rocker-pad 33, messages begin playing in order from the beginning of the recording medium. When message B finishes playing, message D begins playing immediately. The transition from message B to message D is seamless, as if the user had never recorded message C.

Figure 4B:
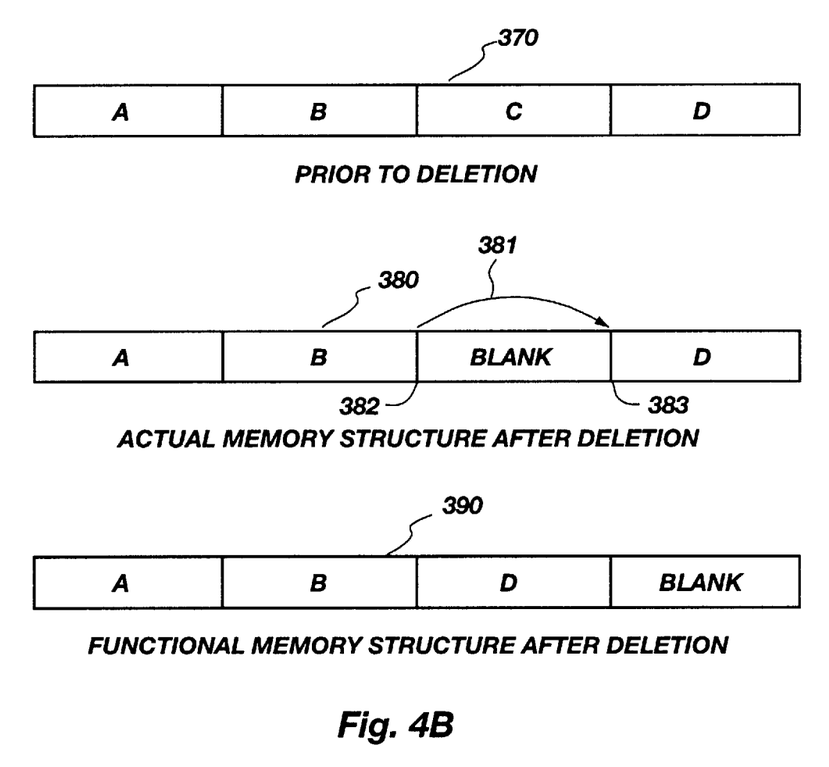
FIG. 4B is a diagram representing memory structure before and after individual message deletion of FIG. 4A.

FIG. 4B is a diagram of the digital memory structure before and after deletion of message C. Prior to deletion, the memory structure appears as shown in box 370 where messages A, B, C and D occupy contiguous memory blocks. After deletion of message C, the actual memory structure appears as shown in box 380. As illustrated, a blank portion of memory is now skipped as shown by arrow 381. However, functionally the messages will play back as if the actual memory structure is as shown in box 390, where messages A, B and D appear as one contiguous block of memory. Message B plays until the deletion point 382 in box 380. Playback then skips to point 383, and message D begins playing.

Figure 5A:
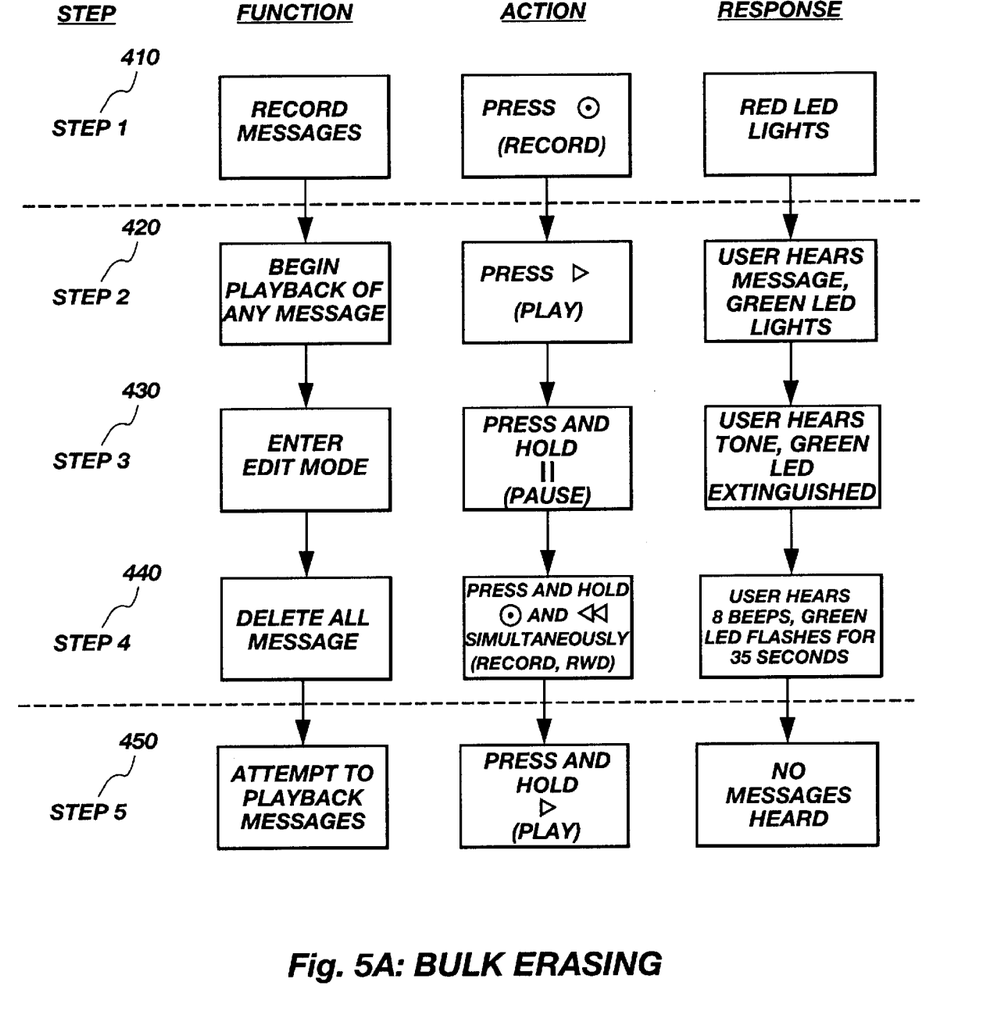
FIG. 5A is a flowchart of steps for erasing all messages previously recorded on a digital medium.

FIG. 5A is a flowchart of the steps to delete all messages from the recording medium. In effect, a user plays any previously recorded message and stops the message at any time while the message is playing. A user enters an edit mode and deletes all messages. The end result of the deletion process is that when the user tries to play any message, none will be played.

Step 1 designated by 410 is not part of the deletion process, but illustrates that a previously recorded message must exist. The example below will assume that a plurality of messages exist labelled A, B, C and D.

Step 2 designated as 420 shows that the user taps the rocker-pad 33 switch labeled with the play symbol 31*a* to play any message. The green LED 60 lights during playback.

Step 3 designated as 430 shows that the user listens to verify that a message is playing. The user must pause the playback at any time during the message and enter the edit mode. This is accomplished by pressing and holding the pause button 31*b* on the rocker-pad 33. After a few seconds, the user hears a tone. The user may then release the pause button 31*b*. The recorder is now in the edit mode.

The user must then execute step 4 designated as 440. The user simultaneously presses and holds the record 36 and reverse 31*c* buttons. The user hears 8 short beeps indicating that the deletion process has begun. The green LED flashes for anywhere from 10 to 40 seconds with the LEDs used in the present invention. This may vary depending upon the LEDs installed. When flashing stops, the recording medium is blank. It should be noted that the bulk erasing process cannot be interrupted, even by removing the batteries. If removed, the process resumes when the batteries are replaced.

Step 4 actually ends the deletion process, but step 5 designated as 450 illustrates a significant point of novelty of the present invention. When the user presses and holds the play button 31*a* on the rocker-pad 33, no messages begin playing. The erasing of messages is rapid and complete. There is no way to restore the erased messages.

Figure 5B:
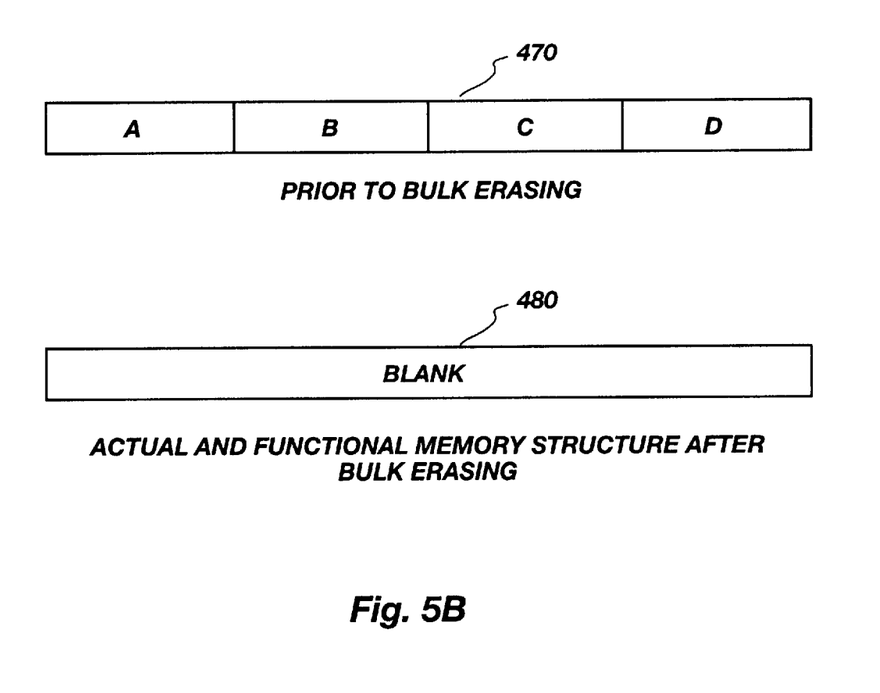
FIG. 5B is a diagram representing memory structure before and after bulk message erasure of FIG. 5A.

FIG. 5B is a diagram of the digital memory structure before and after deletion of all messages. Prior to deletion, the memory structure appears as shown in box 470 where messages A, B, C and D occupy contiguous memory blocks. After deletion of all messages, the actual and functional memory structures appear as shown in box 480. As illustrated, all memory space is blank.

Figure 6A:
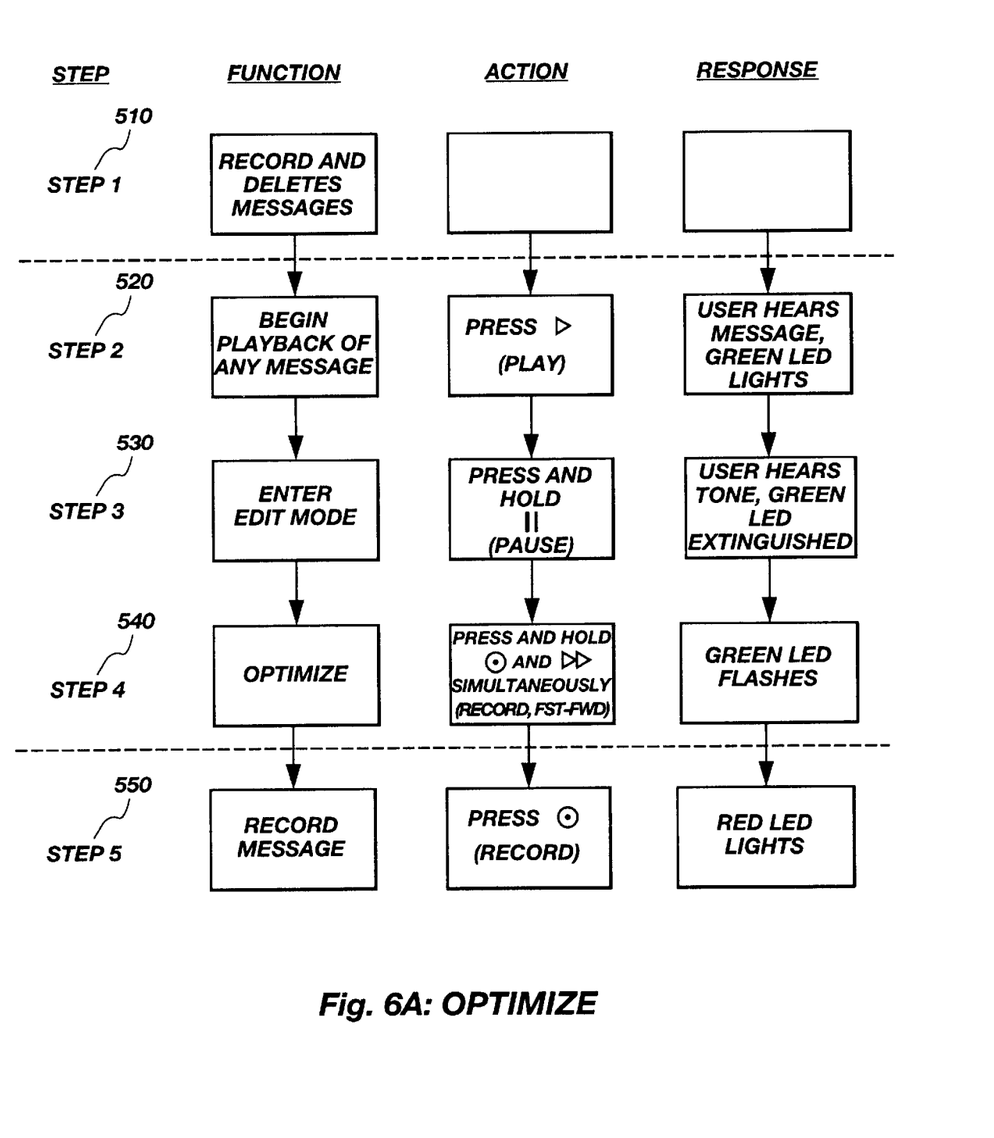
FIG. 6A is a flowchart of steps for optimizing memory space on a digital recording medium with existing noncontiguous previously recorded digital messages.

FIG. 6A is a flowchart of the steps to optimize memory space on the memory medium. In effect, a user plays any previously recorded message and enters the edit mode. The optimization process is executed. The end result of optimization is that all recorded messages play back exactly as before optimization. However, the amount of blank space available for recording new messages is maximized.

Step 1 designated by 510 is not part of the optimization process, but illustrates that previously recorded noncontiguous messages must exist, and for this illustration are labelled message A, B, C and D.

Step 2 designated as 520 shows that the user taps the rocker-pad switch labeled with the play symbol 31*a*. The green LED 60 lights during playback.

Step 3 designated as 530 shows that the user verifies that any message is playing, and then enters the edit mode. This is accomplished by pressing and holding the pause button 31*b* on the rocker-pad 33. After a few seconds, the user hears a tone. The user may then release the pause button 31*b*. The recorder is now in the edit mode.

The user must then execute step 4 designated as 540. The user simultaneously presses and holds the record 36 and fastforward 31*d* buttons. The green LED 60 flashes indicating that the optimization process is being executed. The process takes approximately 30 seconds for each 15 minutes of available recording medium.

Step 4 actually ends the optimization process, but step 5 designated as 550 illustrates one of the points of novelty of the present invention. When the user taps the record button 36, the user begins recording a new message. All of the blank space on the recording medium is now contiguously arranged. This means that the user can now record the longest message possible in the available memory space.

Figure 6B:
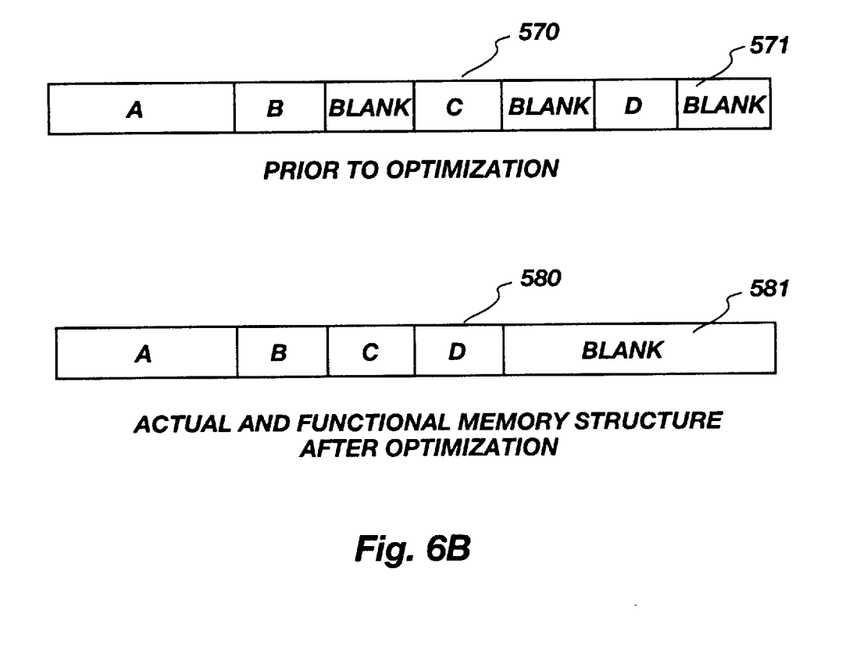
FIG. 6B is a diagram representing memory structure before and after memory consolidation and optimization of FIG. 6A.

Before compacting, the only space available for recording a message is shown as memory space 571 (FIG. 6B). After optimization, the available memory for a message is shown as memory block 581, approximately three times longer than memory space 571 before optimization. This result is very situation specific and the example given here is for illustration purposes only.

It is to be understood that the described embodiments of the invention are illustrative only, and that modifications thereof may occur to those skilled in the art. Accordingly, this invention is not to be regarded as limited to the embodiments disclosed, but is to be limited only as defined by the appended claims herein.

What is claimed is:

1. A system for editing messages in a recorder system, comprising:
    a handheld recorder having flash memory for storing messages in message segments, the flash memory having a plurality of sequential memory blocks, each memory block having a plurality of memory locations, the messages being stored as message segments, wherein related message segments are logically related to each other using memory address pointers, and wherein a first message segment of each of the messages are linked to each other using the memory address pointers to thereby facilitate movement between the messages;
    means for selecting an edit point within a message at which the message is to be edited, the edit point being at a first location within the message defining an end point of a first message segment;
    means for generating an edited message, the edited message comprising a second message segment;
    means for storing said second message segment in a second memory block;
    means for altering said memory address pointers to insert the address of the second message segment;
    means for playing said message segments in the flash memory in accordance with said ordered sequence by accessing the message segments corresponding to the addresses contained in the memory address pointers so that the message segments are played sequentially.

2. The system of claim 1, wherein said second message segment comprises a message fragment to be inserted into said message at the edit point, said means for altering the memory address pointers comprises means for connecting the address of the edit point to a beginning of the second memory segment and the end point of the second memory segment to an address after the edit point, and said means for playing comprises means for sequentially playing said first message segment to said edit point, playing said second message segment, and playing said message after the edit point sequentially to form a continuous message.

3. The system of claim 1, wherein said edited message generating means comprises means for playing said message said edit point to a second edit point and means for removing a segment of said message between said edit point and said second edit point, said memory address pointers altering means comprising means for connecting the address of said edit point to the address of said second edit point, and wherein said playing means comprises means for playing said first message segment and a remainder of the message after said second edit point to thereby form a continuous message.

4. The system of claim 3, wherein said edit point is at an address at a beginning of a message in the flash memory and said second edit point is at an address at an end of the message in the flash memory so that the entire message is deleted from the flash memory.

5. The system of claim 1, wherein said handheld recorder further comprises a microcontroller for generating message editing commands, and a single, manually operable rocker pad mounted upon said handheld recorder and connected to the microcontroller.

6. The system of claim 1, wherein the handheld recorder further comprises means for moving a plurality of previously recorded messages stored in nonsequential memory blocks in the flash memory so that the plurality of messages are located in sequential memory blocks within the flash memory.

7. A method for editing messages in a recorder system, comprising:
    providing a handheld recorder having flash memory for storing messages in message segments, the flash memory having a plurality of sequential memory blocks, each memory block having a plurality of memory locations, the messages being stored as message segments, wherein related message segments are logically related to each other using memory address pointers, and wherein a first message segment of each of the messages are linked to each other using the memory address pointers to thereby facilitate movement between the messages;
    selecting an edit point within a message at which the message is to be edited, the edit point being at a first location within the message defining an end point of a first message segment;
    generating an edited message, the edited message comprising a second message segment;
    storing said second message segment in a second memory block;
    altering said memory address pointers to insert the address of the second message segment;
    playing said message segments in the flash memory in accordance with said ordered sequence by accessing the message segments corresponding to the addresses contained in the memory address pointers so that the message segments are played sequentially.

8. The method of claim 7, wherein said second memory segment comprises a message segment to be inserted into said message at the edit point; said altering the memory address pointers comprises connecting a beginning address of the edit point to an address of a beginning of said second message segment and an address of an end of the second message segment to an address of the message after the edit point; and wherein playing the edited message comprises sequentially playing said first message segment up to said edit point, playing said second message segment, and playing the remainder of the message after said edit point to form a continuous message.

9. The method of claim 7, wherein editing comprises playing said message from said edit point to a second edit point, and removing said second message segment between said edit point and said second edit point; said altering said memory address pointers comprises connecting said address of said edit point in said message to said address of said second edit point; and wherein playing the message segments comprises playing the first message segment and the message after the second edit point to form a continuous message.

10. The method of claim 7, wherein selecting the edit point comprises pausing play of the message at said edit point and entering an edit mode.

11. The method of claim 9, wherein said first edit point comprises an address at a beginning of a message and said second edit point comprises an address at an end of a message so that the entire message is deleted from the flash memory.

12. The method of claim 11 wherein the first edit point comprises an address at the beginning of a first message in the flash memory and said second edit point comprises an address at the end of a last message in the flash memory so that all of said messages within said flash memory are deleted.

13. The method of claim 7 further comprising moving previously recorded messages located in nonsequential memory blocks within the flash memory to sequential memory blocks within the flash memory.

* * * * *